(12) United States Patent
Ookura et al.

(10) Patent No.: US 6,461,438 B1
(45) Date of Patent: Oct. 8, 2002

(54) HEAT TREATMENT UNIT, COOLING UNIT AND COOLING TREATMENT METHOD

(75) Inventors: Jun Ookura; Koji Harada, both of Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 57 days.

(21) Appl. No.: 09/713,891

(22) Filed: Nov. 16, 2000

(30) Foreign Application Priority Data

Nov. 18, 1999 (JP) .......................................... 11-328795

(51) Int. Cl.[7] .............................................. C23C 16/00
(52) U.S. Cl. ...................... 118/724; 118/712; 438/758; 432/36
(58) Field of Search ................................ 118/724, 712; 438/758; 432/36, 49

(56) References Cited

U.S. PATENT DOCUMENTS

| | | | |
|---|---|---|---|
| 5,272,644 A | * 12/1993 | Katsumata et al. | .......... 364/477 |
| 5,678,989 A | * 10/1997 | Okase et al. | ................ 432/241 |
| 5,895,596 A | * 4/1999 | Stoddard et al. | ............. 219/497 |
| 5,941,083 A | 8/1999 | Sada et al. | |
| 6,117,245 A | * 9/2000 | Mandrekar et al. | .......... 118/724 |
| 6,182,602 B1 | * 2/2001 | Redeker et al. | .......... 118/723 R |
| 6,316,045 B1 | * 11/2001 | Bernard et al. | ................. 427/8 |

OTHER PUBLICATIONS

Official Action mailed on Oct. 19, 2001 in counterpart application filed in Taiwan.

* cited by examiner

*Primary Examiner*—Alexander Ghyka
(74) *Attorney, Agent, or Firm*—Oblon, Spivak, McClelland, Maier & Neustadt, P.C.

(57) ABSTRACT

A substrate cooling unit comprises a cooling plate on which the substrate is placed, a cooling temperature adjusting element which adjusts the cooling plate to a predetermined temperature, a temperature controller which controls a temperature of the cooling temperature adjusting element according to a transfer function, a temperature sensor attached to the cooling plate, and a control parameter changing section which changes at least any one setting of a proportional operation coefficient, integral time or derivative time among control parameters in the transfer function based on a temperature of the cooling plate detected by the temperature sensor after the substrate that is an object to be cooled is placed on the cooling plate.

7 Claims, 15 Drawing Sheets

| Temperature of Heating Plate (°C) | Pattern 1 | Pattern 2 | Pattern 3 |
|---|---|---|---|
| 90 | 28 | 25 | 32 |
| 120 | 30 | 33 | 38 |
| 150 | 57 | 39 | 46 |
| 180 | 61 | 44 | 61 |

(s)

| Temperature of Heating Plate (°C) | Pattern 1 | Pattern 2 | Pattern 3 |
|---|---|---|---|
| 90 | 0.3 | 0.4 | 0.4 |
| 120 | 0.2 | 0.4 | 0.5 |
| 150 | 0.4 | 0.4 | 0.6 |
| 180 | 0.5 | 0.5 | 0.8 |

(°C)

| Temperature of Heating Plate (°C) | pattern 1 | pattern 2 | pattern 3 |
|---|---|---|---|
| 90 | 0.66 | 0.70 | 0.84 |
| 120 | 0.85 | 0.92 | 1.06 |
| 150 | 1.19 | 1.12 | 1.38 |
| 180 | 1.68 | 1.63 | 1.90 |

(°C)

| Temperature of Heating Plate (°C) | Pattern 1 | Pattern 2 | Pattern 3 |
|---|---|---|---|
| 90 | 0.35 | 0.43 | 0.52 |
| 120 | 0.26 | 0.39 | 0.66 |
| 150 | 0.56 | 0.54 | 0.89 |
| 180 | 0.95 | 0.77 | 1.28 |

(°C)

| Initial Temperature of Wafer (°C) | Recovery Time (s) | |
|---|---|---|
| | Cooling Water 15°C | Cooling Water 25°C |
| 90 | 24 | 25 |
| 120 | 26 | 27 |

FIG.20

| Initial Temperature of Wafer (°C) | Recovery Time (s) | |
|---|---|---|
| | Cooling Water 15°C | Cooling Water 25°C |
| 90 | 25~35 | 27~36 |
| 120 | 27 | 28~29 |
| 150 | 28.5 | 29.5~31 |
| 200 | 33~34 | 36~38 |

FIG.21

| Initial Temperature of Wafer (°C) | Peak Temperature (°C) | Reaching Time (s) |
|---|---|---|
| 200 | 26 | 9 |
| 250 | 27 | 9 |

HEAT TREATMENT UNIT, COOLING UNIT AND COOLING TREATMENT METHOD

CROSS-REFERENCE TO RELATED APPLICATIONS

This application is based upon and claims the benefit of priority from the prior Japanese Patent Application No. 11-328795, filed Nov. 18, 1999, the entire contents of which are incorporated herein by reference.

BACKGROUND OF THE INVENTION

The present invention relates to a thermal treatment method of heating or cooling a substrate such as, for example, an LCD substrate or a semiconductor wafer or the like, and a thermal treatment unit.

In processes of manufacturing semiconductor devices, the photolithography is performed on a surface of a substrate such as, for example, a semiconductor wafer (described as "a wafer" hereinafter) or the like. In the photolithography, a sequence of processes are performed in which a predetermined pattern is exposed on the wafer after a resist solution is applied on the surface thereof and subsequently developing is performed thereon.

In such coating and developing processes, heat treatment is performed on the wafer if necessary after the resist coating, the exposing and the developing, and thereafter cooling processing is subsequently performed to cool the wafer in a state of a high temperature, to a certain degree.

A heat treatment unit for performing heat treatment has a heating plate in which a heater is embedded. The wafer is placed on the heating plate and subjected to heat treatment by heat from the heating plate. A temperature sensor is attached to the heating plate so that a temperature of the heating plate can be monitored. A signal from the temperature sensor is inputted to a controller for controlling a temperature of the heater based on the sensor signal sent from the sensor.

A cooling unit for performing cooling treatment has a cooling plate in which a Peltier element is embedded. The wafer at a high temperature after the heat treatment is placed on the cooling plate and subjected to cooling treatment by cold energy of the cooling plate. A temperature sensor is attached to also the cooling plate so that a controller controls a temperature of the Peltier element based on a signal from the temperature sensor similarly to the above-described heating plate.

Now, a state of the temperature of the heating plate when the wafer is heated up to a predetermined temperature is shown in FIG. 22. In a graph in FIG. 22, a horizontal axis indicates heating time [sec.] and a vertical axis indicates the temperature of the heating plate [° C.]. When the wafer is placed on the heating plate, the heating plate loses an amount of heat to the wafer and its temperature is lowered, as shown by Graph Line "k" in FIG. 22 (time $t_1$ to $t_2$ in FIG. 22). The controller, which recognizes the drop in temperature by the temperature sensor, increases an amount of electric power to the heater to start heat treatment. At this time, the temperature of the heating plate overshoots since heating by the heater is abruptly performed (time $t_2$ to $t_3$ in FIG. 22). Subsequently, the controller, which recognizes the overshoot by the temperature sensor, decreases the amount of electric power to the heater to lower the temperature of the heating plate (time $t_3$ to $t_4$ in FIG. 22). After passing through the processes as described above, the temperature of the heating plate becomes stable. Incidentally, PID control, in which a proportional element, an integral element, and a derivative element are added, is adopted for the controller so that excess properties can be improved by reducing a deviation to a minimum.

Next, a state of a change in temperature of the cooling plate when the wafer after the heat treatment is cooled to, for example, 23° C. is shown in FIG. 23. In a graph in FIG. 23, a horizontal axis indicates cooling time [sec.] and a vertical axis indicates the temperature of the cooling plate [° C.]. As shown by Graph Line "1" in FIG. 23, the temperature of the cooling plate maintains 23° C. before the wafer is placed thereon. Then, when the wafer at a high temperature is placed on the cooling plate, the cooling plate receives an amount of heat from the wafer and the temperature of the cooling plate is raised (time $t_1$ to $t_2$ in FIG. 23). The controller, which recognizes the rise in temperature by the temperature sensor, subsequently increases an amount of electric power to the Peltier element to start cooling treatment. At this time, the temperature of the cooling plate undershoots 23° C. since cooling by the Peltier element is abruptly performed (time $t_2$ to $t_3$ in FIG. 23). Thereafter, the controller, which recognizes the undershoot by the temperature sensor, decreases the amount of electric power supplied to the Peltier element to raise the temperature of the cooling plate (time $t_3$ to $t_4$ in FIG. 23). After passing through the processes as described above, the temperature of the cooling plate is stabilized to maintain 23° C. Also in this case, PID control is adopted for the controller so that excess properties can be improved.

Incidentally, the wafer having a temperature of, for example, 23° C. (a room temperature) undergoes heat treatment at 200° C. in so-called prebaking (PREBAKE) for the sake of heating-removal of a resist solvent in a resist after resist coating, the wafer having a temperature of 23° C. undergoes heat treatment at 90° C. in post-exposure baking (PEB), and the wafer having a temperature of 23° C. undergoes heat treatment at 30° C. in postbaking (POSTBAKE) performed after developing treatment.

Conventionally, however, in spite of variations in heating temperatures under various heat treatments as described, one type of various data which are inputted to a proportional operation coefficient, integral time and derivative time among control parameters are used in PID control computed by a controller.

Therefore, although there is no particular problem when the wafer is heated to a specific temperature, when the wafer undergoes heat treatment at a temperature different from the specific temperature, a deviation is increased and excess properties are deteriorated since the controller cannot cope with the different temperature, thereby lengthening recovery time of the heating plate, more specifically, time which is required to stabilize the heating plate at a predetermined temperature. As a result, there is a risk of causing a reduction in a throughput.

In addition, there is a case where heating temperatures are different corresponding to recipes, for example, even in the same PEB, and also there is a risk that the recovery time is lengthened.

Similarly also in cooling treatment, various data inputted to control parameters are fixed to one pattern in PID control computed by a conventional controller. Therefore, although there is no particular problem when the wafer, which is heated to a specific temperature, is cooled to 23° C., when the wafer, which is heated to a temperature different from the specific temperature, is placed on a cooling plate, the controller cannot cope with the different temperature, thereby lengthening recovery time of the cooling plate and causing a reduction in a throughput.

BRIEF SUMMARY OF THE INVENTION

The present invention is made in view of the aforesaid points and its object is to shorten recovery time in heat treatment or cooling treatment.

In light of the above object, according to a first aspect of the present invention, a heat treatment unit of the present invention comprises a heating plate on which a substrate is placed, a heating element capable of heating the heating plate at different temperatures, a temperature controller which control a temperature of the heating element according to a transfer function, and a control parameter changing section which changes a setting of a control parameter in the transfer function at each of the different temperatures.

According to a second aspect of the present invention, a heat treatment unit of the present invention comprises a heating plate on which a substrate is placed, a heating element capable of heating the single heating plate at different temperatures, a temperature controller which controls a temperature of the heating element according to a transfer function represented by the following relational expression (1), and a control parameter changing section which changes at least any one setting of a proportional operation coefficient, integral time or derivative time among control parameters in the transfer function.

$$u=KP\{e+(1/TI)\cdot\int edt+TD\cdot de/dt\} \quad (1)$$

Therein, "u" expresses an amount of operation, "e" expresses a deviation (a difference between a target temperature and a detected signal (an observed temperature)), $K_P$ expresses the proportional operation coefficient (a proportional gain), $T_I$ expresses the integral time and $T_D$ expresses the derivative time, respectively.

According to a third aspect of the present invention, a cooling unit which performs cooling treatment on a substrate of the present invention comprises a cooling plate on which the substrate is placed, a cooling temperature adjusting element which adjusts the cooling plate to a predetermined temperature, a temperature controller which controls a temperature of the cooling temperature adjusting element according to a transfer function, a temperature sensor attached to the cooling plate, and a control parameter changing section which changes a setting of a control parameter in the transfer function based on a temperature of the cooling plate detected by the temperature sensor after the substrate that is an object to be cooled is placed on the cooling plate.

According to a fourth aspect of the present invention, a cooling unit which subjects a substrate to cooling treatment comprises a cooling plate on which the substrate is placed, a cooling temperature adjusting element which adjusts the cooling plate to a predetermined temperature, a temperature controller which controls a temperature of the cooling temperature adjusting element according to a transfer function represented by the following relational expression (2), a temperature sensor attached to the cooling plate, and a control parameter changing unit which changes at least any one setting of a proportional operation coefficient, integral time or derivative time among control parameters in the transfer function based on a temperature of the cooling plate detected by the temperature sensor after the substrate that is an object to be cooled is placed on the cooling plate.

$$u'=KP'\{e'+(1/TI')\cdot\int e'dt+TD'\cdot de'/dt\} \quad (2)$$

Therein, "u'" expresses an amount of operation, "e'" expresses a deviation (a difference between a target temperature and a detected signal (an observed temperature)), $K_P'$ expresses the proportional operation coefficient (a proportional gain), $T_I'$ expresses the integral time and $T_D'$ expresses the derivative time, respectively.

According to a fifth aspect of the present invention, a cooling treatment method of a substrate of the present invention comprises the step of changing a setting of a control parameter in a transfer function based on a peak temperature when a temperature of a cooling plate is raised by the substrate to reach the peak temperature on the occasion of placing the substrate on the cooling plate.

According to a sixth aspect of the present invention, a cooling treatment method of a substrate of the present invention comprises the steps of placing the substrate on a cooling plate, cooling the substrate to a predetermined temperature by controlling a temperature of the cooling plate according to a transfer function represented by the following relational expression (2), and changing at least any one setting of a proportional operation coefficient, integral time or derivative time among control parameters in the transfer function based on a peak temperature when the temperature of the cooling plate is raised by the substrate to reach the peak temperature on the occasion of placing the substrate on the cooling plate.

$$u'=KP'\{e'+(1/TI')\cdot\int e'dt+TD'\cdot de'/dt\} \quad (2)$$

Therein, "u" expresses an amount of operation, "e" expresses a deviation (a difference between a target temperature and a detected signal (an observed temperature)), $K_P'$ expresses the proportional operation coefficient (a proportional gain), $T_I'$ expresses the integral time and $T_D'$ expresses the derivative time, respectively.

According to the heat treatment unit of the present invention, the settings of the control parameters in the transfer function are changed at every different temperature by the changing unit, whereby the temperature control means can properly perform the control corresponding to various heating temperatures. Accordingly, it is possible to improve excess properties and shorten recovery time regardless of the temperature when the heat treatment is performed on the substrate. Moreover, the stability of the temperature control is increased, whereby the substrate can be uniformly heated, resulting in the improvement of the uniformity of the surface portion thereof. Further, when PID control, in which even an integral element and a derivative element are added, is adopted for the temperature controller, a steady-state deviation (an offset) or thermal vibration is reduced, whereby the temperature control with higher precision can be performed.

According to the cooling unit of the present invention, the settings of the control parameters can be changed based on the temperature of the cooling plate detected by the temperature sensor after the substrate that is an object to be cooled is placed on the cooling plate, whereby the substrate can be efficiently cooled under the always appropriate control parameters even if its temperature is anything other than an assumed temperature. Therefore, recovery time can be more shortened than the conventional one. Additionally, it is possible to perform PID control by changing at least any one setting of a proportional operation coefficient, integral time or derivative time among control parameters based on the temperature of the cooling plate detected by the temperature sensor after the substrate that is the object to be cooled is placed on the cooling plate, so that the temperature controller, in which the settings of the respective control parameters are changed, can optimally control the temperature of the cooling temperature adjusting element.

According to the cooling treatment method of the present invention, the following effects can be obtained. For example, when the substrate after the heat treatment is placed on the cooling plate, the cooling plate receives an amount of heat from the substrate and its temperature is raised. Thereafter, the temperature of the cooling plate is raised to reach a peak temperature. Incidentally, if the relation between the peak temperature and an initial temperature of the substrate before the cooling treatment is inspected in advance by experiments or the like, it is possible to estimate the initial temperature of the substrate based on the peak temperature observed by the temperature sensor or the like provided on the cooling plate. Accordingly, the temperature of the cooling plate can be optimally controlled regardless of the temperature of the substrate when it is placed on the cooling plate. As a consequence, it is possible to improve excess properties and shorten recovery time regardless of the initial temperature of the substrate.

Additionally, according to the cooling treatment method of the present invention, a steady-state deviation (an offset) or the like is reduced and the temperature control with higher precision can be performed by further adopting PID control in which even an integral element and a derivative element are added in the transfer function.

Additional objects and advantages of the invention will be set forth in the description which follows, and in part will be obvious from the description,.or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 20 is a table showing recovery time characteristics in a second embodiment of cooling treatment in the present invention;

FIG. 21 is a table showing the relation of an initial temperature of the wafer to a peak temperature and reaching time;

DETAILED DESCRIPTION OF THE INVENTION

A preferred embodiment of the present invention will be described below.

Figure 1:
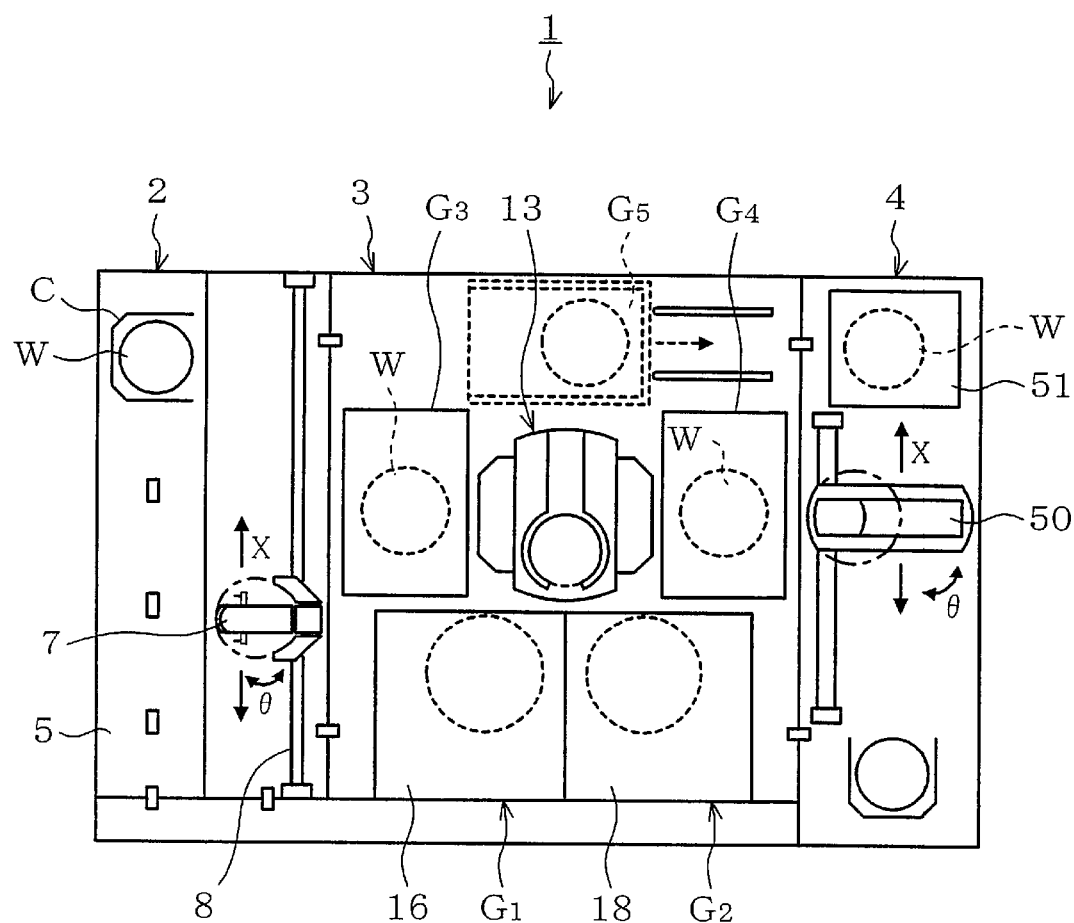
FIG. 1 is a plane view of a coating and developing system provided with a baking unit according to embodiments of the present invention and a cooling unit according to the same.
Figure 2:
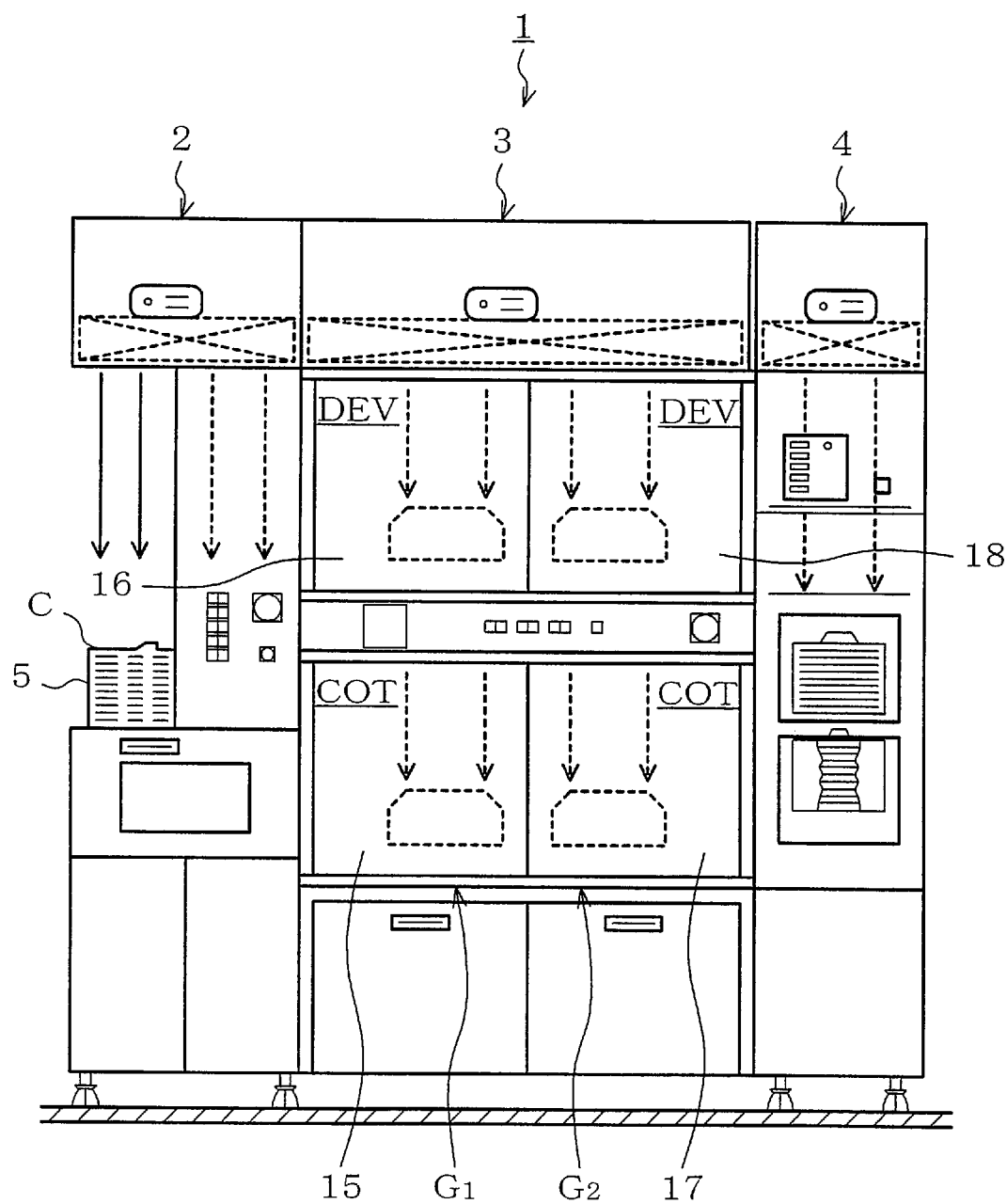
FIG. 2 is a front view of the coating and developing system in FIG. 1.
Figure 3:
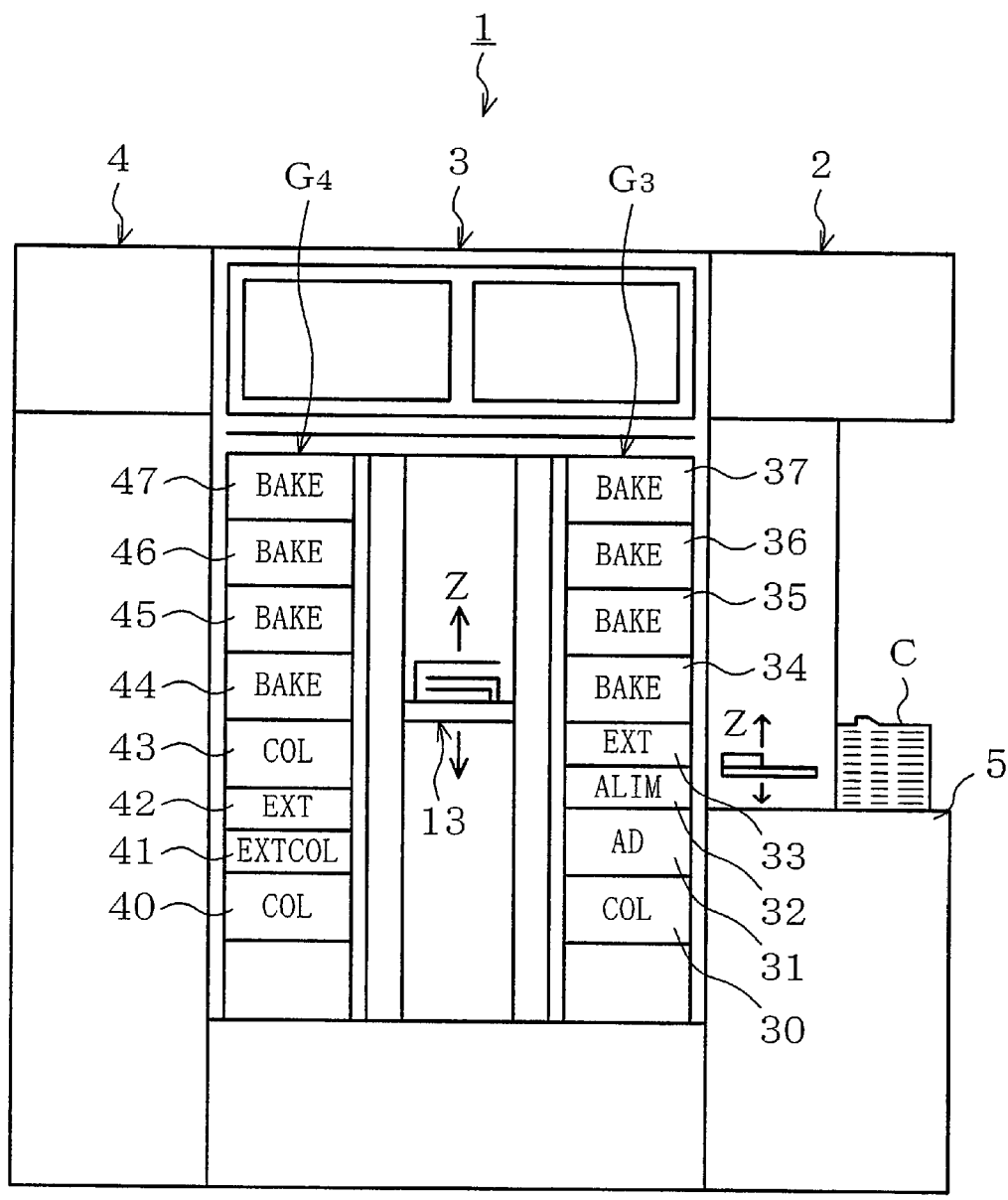
FIG. 3 is a rear view of the coating and developing system in FIG. 1.

FIG. 1 is a plane view of a coating and developing system 1 in which baking units as heat treatment units according to embodiments of the present invention and cooling units as cooling treatment units according to the same are incorporated, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers from/to the outside to/from the coating and developing system 1 in the unit of cassette and for carrying the wafers W into/from a cassette C, a processing station 3 in which various kinds of multi-stage processing units for performing predetermined processing one by one in the coating and developing process are disposed, and an interface section 4 for receiving and delivering the wafer W from/to an aligner (not shown) provided adjacent to the processing station 3, are integrally connected.

In the cassette station 2, a plurality of cassettes C are well mounted at predetermined positions on a cassette mounting table 5 serving as a mounting section in a line in an X-direction (a vertical direction in FIG. 1). Further, a wafer carrier 7, which is transferable in the direction of alignment of the cassettes (the X-direction) and in the direction of alignment of the wafers W housed in the cassette C (a Z-direction; a vertical direction), is provided to be movable along a carrier guide 8 and is selectively accessible to the respective cassettes C.

The wafer carrier 7 is structured so as to access also an alignment unit 32 and an extension unit 33 which are included in a third processing unit group G3 on the side of the processing station 3 as will be described later.

In the processing station 3, a main carrier unit 13 is provided in the center part thereof, and various kinds of processing units are arranged in a multi-stage on the periphery of the main carrier unit 13 to compose processing unit groups. In the coating and developing system 1, there are four processing unit groups G1, G2, G3 and G4, and the first and the second processing unit groups G1, G2 are disposed on the front side of the coating and developing system 1, the third processing unit group G3 is disposed adjacent to the cassette station 2, and the fourth processing unit group G4 is disposed adjacent to the interface section 4. Further, as an option, a fifth processing unit group G5 depicted by broken lines can be additionally arranged on the rear side of the coating and developing system 1.

In the first processing unit group G1, as shown in FIG. 2, two kinds of spinner-type solution coating units, for example, a resist coating unit 15 for performing resist coating treatment on the wafer W, and a developing unit 16 for performing treatment on the wafer W with a developing solution supplied are two-tiered in the order from the bottom. Also in the case of the second processing unit group G2, a resist coating unit 17 and a developing unit 18 are similarly two-tiered in the order from the bottom.

In the third processing unit group G3, as shown in FIG. 3, a cooling unit 30 according to the present embodiment, an adhesion unit 31 for increasing the fixability between a resist solution and the wafer W, the alignment unit 32 for aligning the wafer W, the extension unit 33 for keeping the wafer W waiting, baking units 34, 35, 36 and 37 according to the present embodiment and so on are arranged on, for example, eight-stages in the order from the bottom.

In the fourth processing unit group G4, a cooling unit 40, an extension and cooling unit 41 for spontaneously cooling the placed wafer W, an extension unit 42, a cooling unit 43, baking units 44, 45, 46, 47 and so on are, for example, eight-tiered in the order from the bottom.

In the center part of the interface section 4, provided is a wafer carrier 50. The wafer carrier 50 is structured so as to be accessible to the extension and cooling unit 41, the extension unit 42 which are included in the fourth processing unit group G4, a peripheral aligner 51, and the aligner (not shown).

Figure 4:
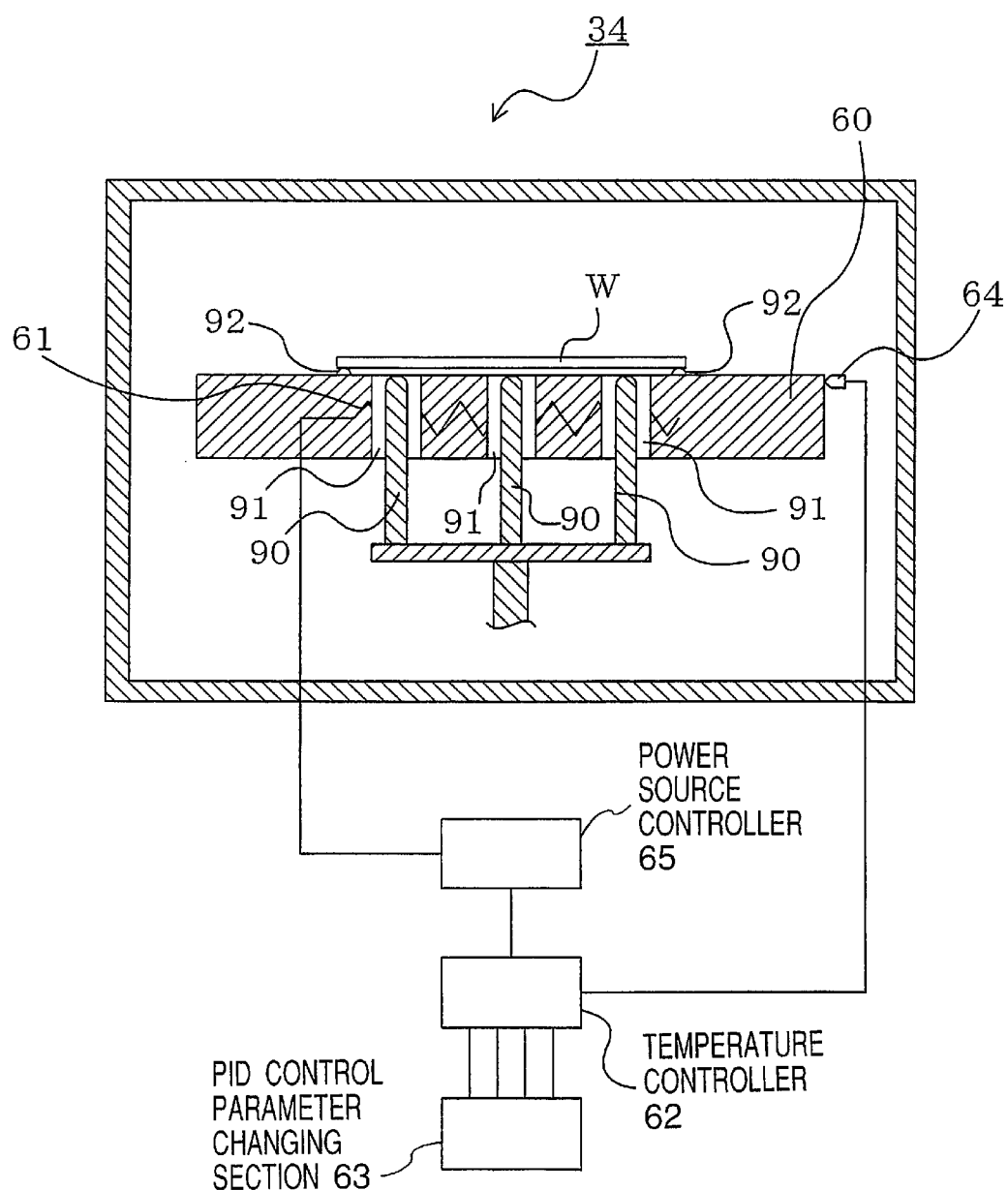
FIG. 4 is an internal view of the baking unit according to the embodiments of the present invention.

Since any of the baking units 34 to 37, 44 to 47 according to the present embodiment has a similar structure, the baking unit 34 will be described as an example. The baking unit 34 is provided with a heating plate 60 having, for example, a disk shape, on which the wafer W is placed, a heater 61 capable of heating the single heating plate 60 at different temperatures, a temperature controller 62 which controls the temperature of the heater 61 according to PID control, and a PID control parameter changing section 63 which changes settings of PID control parameters at every different temperature (a target temperature in each of various heat treatments) as shown in FIG. 4.

To the heating plate 60, attached is a temperature sensor 64. The heater 61 is embedded in the heating plate 60 and besides generates heat by an electric feed from a power source controller 65. The temperature sensor 64 is connected to the temperature controller 62 and the power source controller 65 is connected to the temperature controller 62. Moreover, an amount of operation is calculated by the temperature controller 62 based on a detected signal from the temperature sensor 64, the amount of operation is transmitted to the power source controller 65 and consequently controlled so as to make not only the heater 61 but also the heating plate 60 generate heat within a range of, for example, 0 to 350° C.

Therefore, the single baking unit 34 has a structure in which prebaking (PREBAKE) for performing heat treatment on the wafer W at, for example, 200° C. after a resist coating, post-exposure baking (PEB) for performing heat treatment on the wafer W at, for example, 90° C. after exposing processing, and postbaking (POSTBAKE) for performing heat treatment on the wafer W at, for example, 300° C. after developing treatment can be all performed.

Figure 5:
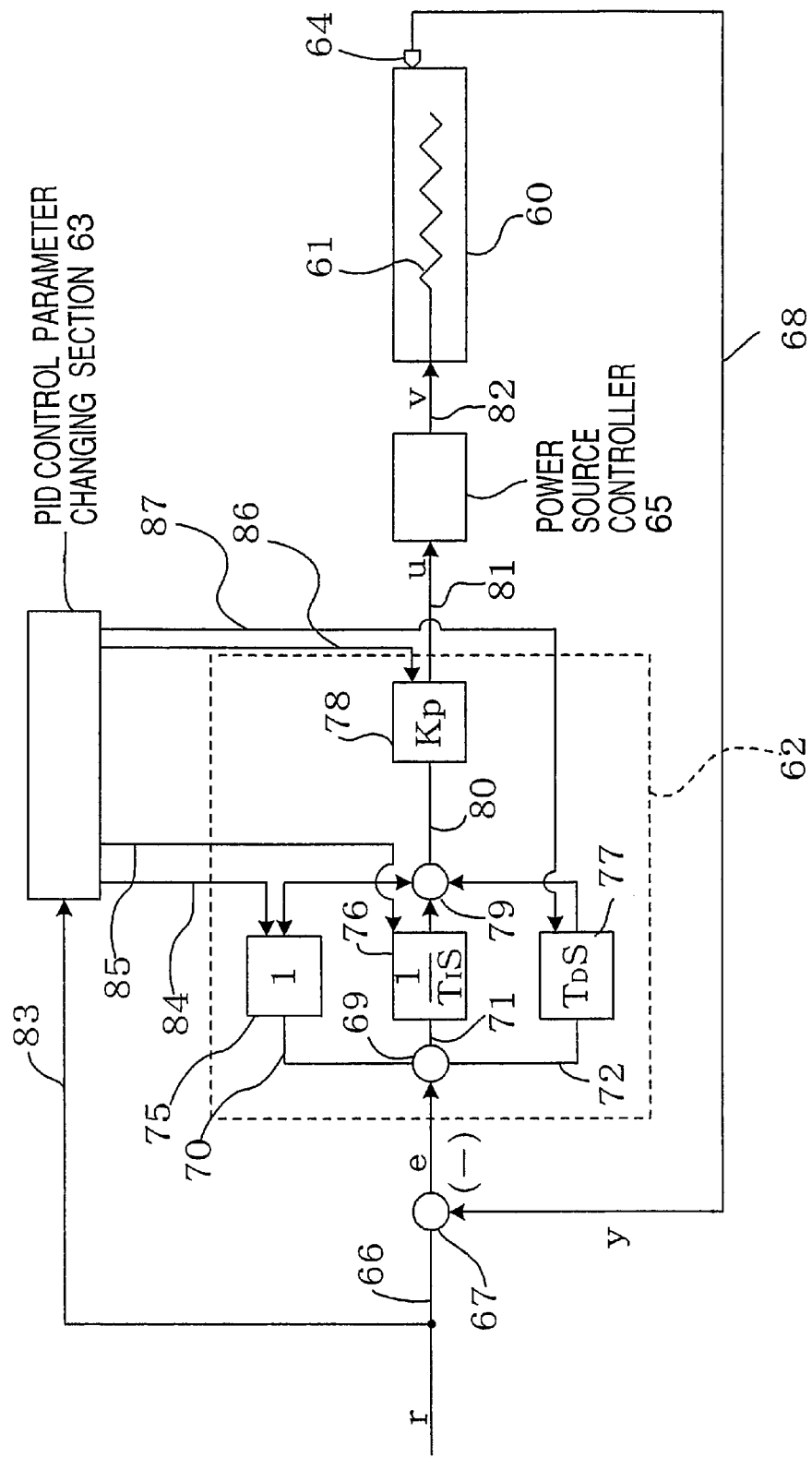
FIG. 5 is a block diagram showing a control system of the baking unit in FIG. 4.

FIG. 5 is a block diagram showing a control system of the baking unit 34. For example, an input line 66 for inputting a target temperature "r" is firstly connected to the temperature controller 62 as shown in FIG. 5. The input line 66 is provided with an addition point 67. The addition point 67 is connected to a feedback line 68 for feedbacking the detected signal from the temperature sensor 64 (an observed temperature Further, lines 70, 71 and 72 are branched from a branch point 69 connected to the input line 66. The line 70 is provided with a proportional element operator 75, the line 71 is provided with an integral element operator 76 and the line 72 is provided with a derivative element operator 77, respectively.

Thus, there is a structure inside the temperature controller 62 that a deviation "e" between the target temperature "r" and the observed temperature "y" is treated by dividing it into three elements of a proportional element, an integral element, and a derivative element so that each element is computed. Moreover, an operator 78 is connected through a line 80 to an addition point 79 which is the confluence of the lines 70 to 72.

Further, the operator 78 is connected through a line 81 to the power source controller 65, and the power source controller 65 is connected through a line 82 to the heater 61. By virtue of this, results of the respective computed elements are totaled at the addition point 79, and an amount of operation "u" is calculated by multiplying the totaled result by a coefficient in the operator 78 and outputted to the power source controller 65. Finally, an amount of electric power "v" supplied to the heater 61 is determined in the power source controller 65.

An input line 83 is connected to the PID control parameter changing section 63. The PID control parameter changing section 63 is connected to the proportional element operator 75 through a line 84, connected to the integral element operator 76 through a line 85, connected to the derivative element operator 77 through a line 87, and connected to the operator 78 through a line 86, respectively.

Integral time $T_I$, derivative time $T_D$, and a proportional operation coefficient (a proportional gain) $K_P$, which are used for computation, are respectively set in the respective integral element operator 76, the derivative element operator 77 and the operator 78, so that computation is performed by using these respective control parameters.

Incidentally, the respective control parameters can be rewritten in the respective operators 75 to 78. More specifically, data on the respective control parameters optimum for the target temperature "r" in each of various heat treatments are inspected in advance by experiments or like and stored in the PID control parameter changing section 63. During the heat treatment, when the target temperature "r" is inputted to the PID control parameter changing section 63 through the input line 83, the PID control parameter changing section 63 selects the respective optimum parameters from the stored data based on the target temperature "r" to change the respective control parameters if necessary.

Besides, in the baking unit 34, provided are three hoisting and lowering pins 90 for hoisting and lowering the wafer W when the wafer W is carried thereto/therefrom, and the hoisting and lowering pins 90 freely ascend and descend in through holes 91 penetrating the heating plate 60, by a drive mechanism which is not shown. Moreover, on the heating plate 60, provided are proximity pins 92 for supporting the wafer W slightly spaced from the upper surface of the heating plate 60. Therefore, a minute amount of space is formed between the underneath surface of the wafer W and the upper surface of the heating plate 60, thereby preventing the underneath surface of the wafer W from directly coming into contact with the upper surface of the heating plate 60 so that the underneath surface of the wafer is not soiled or flawed even if there is dust therebetween.

Figure 6:
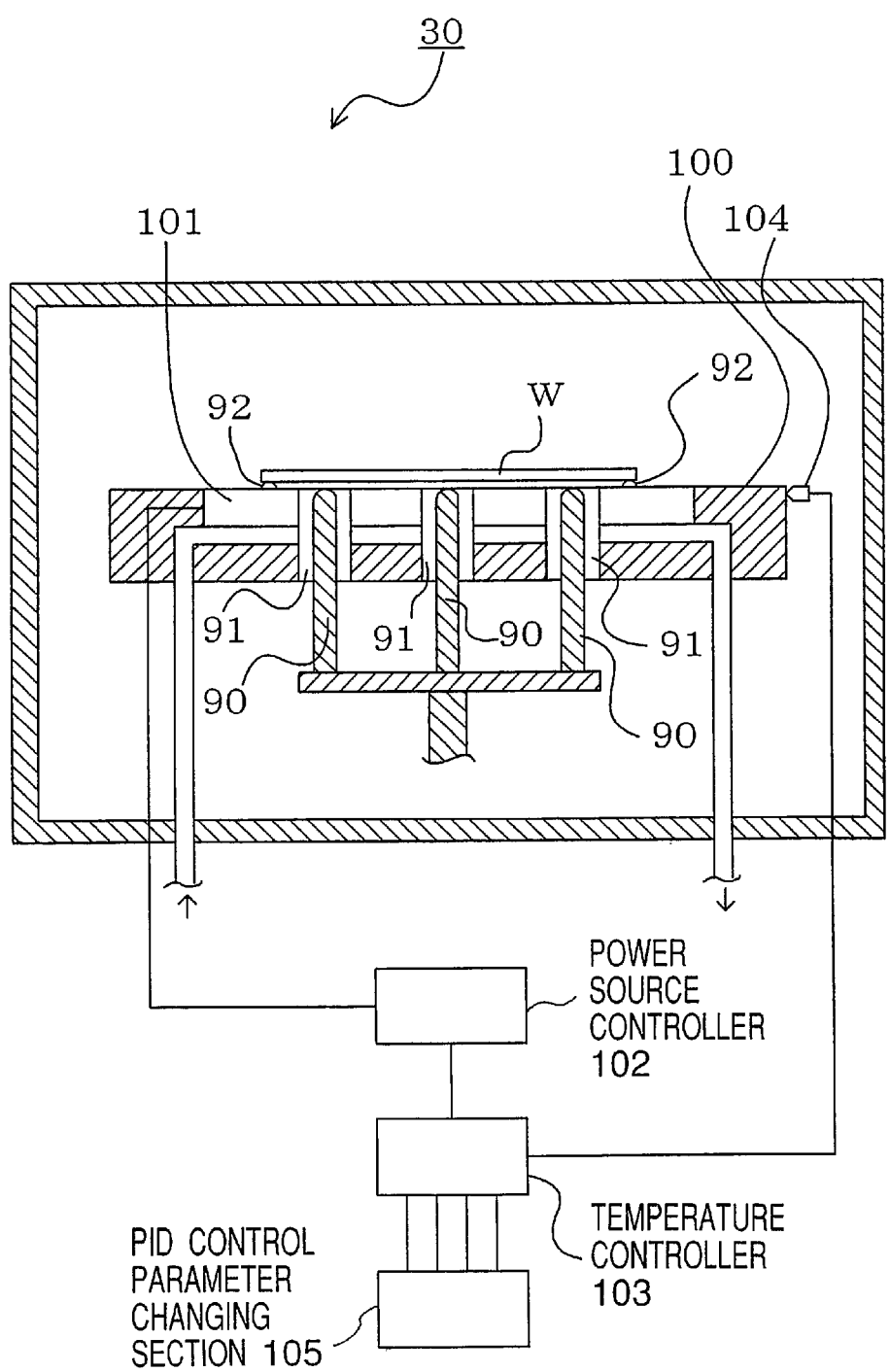
FIG. 6 is an internal view of the cooling unit according to the embodiments of the present invention.

Next, the cooling unit 30 will be explained as an example since any of the cooling units 30, 40 and 43 according to the embodiment of the present invention has a similar structure. The cooling unit 30 is provided with a cooling plate 100 on which the wafer W is placed, a Peltier element 101 for adjusting the cooling plate 100 to a predetermined temperature, a power source controller 102 for supplying electric power to the Peltier element 101, temperature controller 103 for controlling a temperature of the Peltier element 101 according to PID control by sending an amount of operation to the power source controller 102, a temperature sensor 104 attached to the cooling plate 100, and PID control parameter changing section 105 for changing settings of PID control parameters based on a temperature of the cooling plate 100 detected by the temperature sensor 104 after the wafer W that is an object to be cooled is placed on the cooling plate 100, as shown in FIG. 6.

The PID control parameter changing section 105 has a function of changing the settings of the control parameters so that the wafer W can be cooled to, for example, 23° C. as a predetermined temperature.

Figure 7:
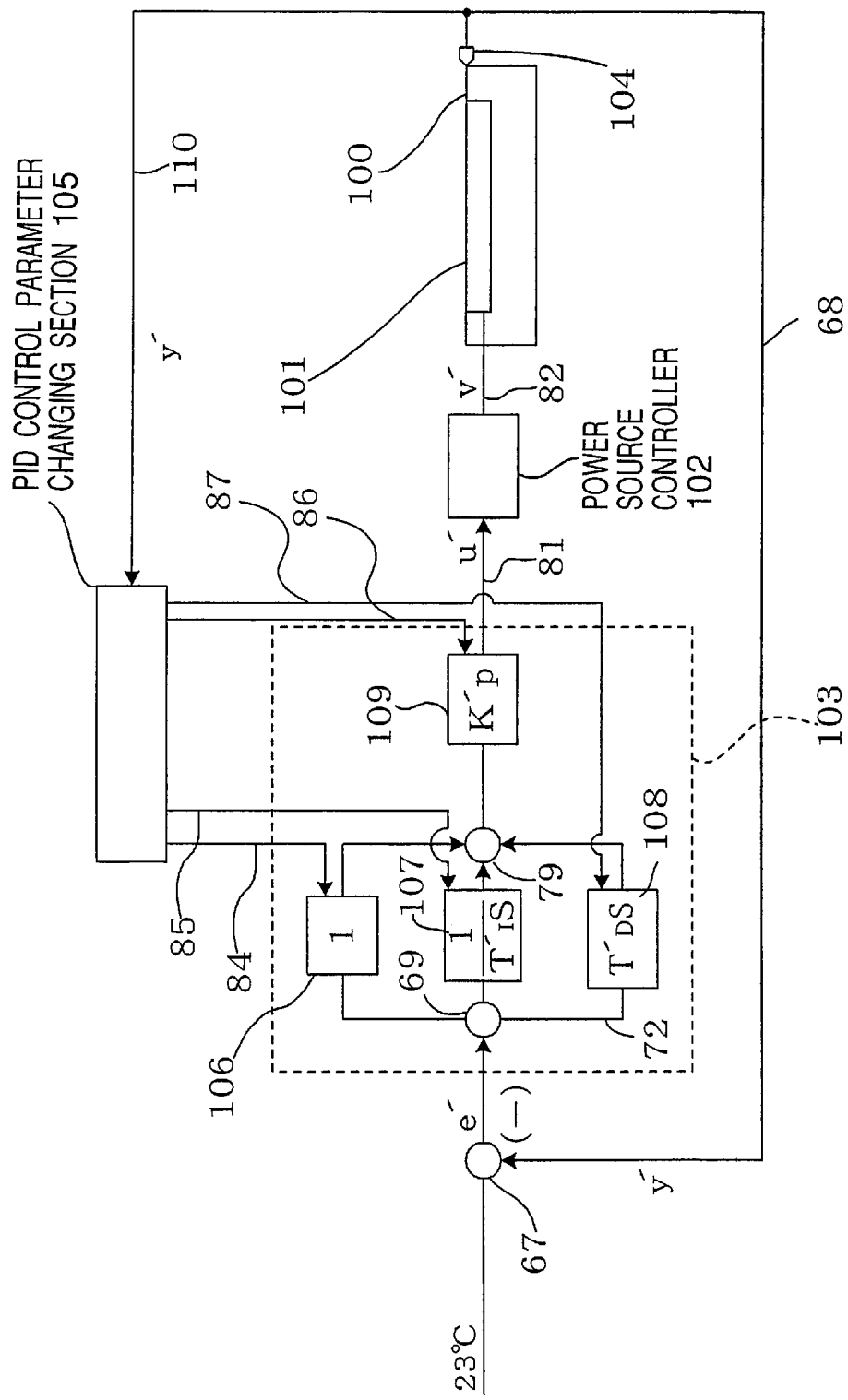
FIG. 7 is a block diagram showing a control system of the cooling unit in FIG. 6.

FIG. 7 is a block diagram showing a control system of the cooling unit 30. For example, as shown in FIG. 7, the temperature controller 103 has a proportional element operator 106, an integral element operator 107, a derivative element operator 108 and an operator 109, and performs the PID control similarly to the temperature controller 62 described above. Integral time $T_I'$, derivative time $T_D'$, and a proportional operation coefficient (a proportional gain) $K_P'$ are respectively set in the integral element operator 107, the derivative element operator 108, and the operator 109, and computation is performed by using these respective control parameters. Further, the PID control parameter changing section 105 and the temperature sensor 104 are connected through a line 110 so that a detected signal from the temperature sensor 104 (an observed temperature "y'") is transmitted to the PID control parameter changing section 105. It should be noted that the same reference numerals and symbols will be used for components having the substantially same functions and structures to omit the repeated description in FIG. 5 and FIG. 7.

Besides, in the cooling unit 30, provided is a flow path 111 for dissipating heat of the Peltier element 101. The flow path 111 runs inside the cooling plate 100 so that cooling water, which is supplied from a cooling water supply mechanism which is not shown, flows therein. In addition, the three hoisting and lowering pins 90 freely ascend and descend in the through holes 91 and the proximity pins 92 are provided on the cooling plate 100 in the same manner as that in the baking unit 34 described above.

Next, functions of the above-structured baking unit 34 and the cooling unit 30 after the heat treatment in the baking unit 34 will be explained based on an example of coating and developing treatment of the wafer W performed in the coating and developing system 1.

First, the wafer carrier 7 takes an unprocessed wafer W out of the cassette C to carry it into the alignment unit 32 included in the third processing unit group G3. Second, the wafer, of which alignment is completed in the alignment unit 32, is sequentially transferred to the adhesion unit 31, the cooling unit 30, and the resist coating unit 15 or 17 by the main carrier unit 13 to undergo predetermined processings. After that, the wafer W is transferred to the baking unit 34 and a residual solvent in the resist is vaporized.

The heat treatment of the wafer W will be now described. First, the temperature control of the heating plate 60 by the temperature controller 62 will be explained. The target temperature "r" of the heating plate 60 is inputted through the input line 66 as shown in FIG. 5. Moreover, the target temperature "r" is also inputted to the PID control parameter changing section 63 and the PID control parameter changing section 63 sets the respective control parameters of the respective operators 75 to 78 based on the target temperature "r".

Meanwhile, a temperature of the heating plate 60 is detected from the temperature sensor 64 and the detected signal (the observed temperature "y") is transmitted through the feedback line 68 to the addition point 67. At the addition point 67, a subtraction is performed between the target temperature "r" and the detected signal (the observed temperature "y") and a difference between the target temperature "r" and the detected signal (the observed temperature "y") is calculated as the deviation "e". The deviation "e" obtained in this manner is divided into three components of a proportional component "p", an integral component "i", and a derivative component "d" and the three components are transmitted to the respective operators 75 to 77 through the respective lines 70 to 72.

The computation is performed in the respective operators 75 to 77 by using the respective control parameters such as the integral time $T_I$, and the derivative time $T_D$, and transmitted to the addition point 79. The results of the computation in the above-described respective operators 75 to 77 are totaled at the addition point 79, and further multiplied by the proportional operation coefficient $K_P$ in the operator 78 so that the amount of operation "u", which is represented by a formula (3) described below, is calculated.

$$u = KP\{e + (1/TI) \cdot \int e d\tau + TD \cdot de/dt\} \quad (3)$$

Therein, "$\int e d\tau$" indicates the integral component of the deviation "e" and "de/dt" indicates the derivative component of the deviation "e".

The following is a formula (4) when the amount of operation "u" is considered as a function of time and represented as a function u(t) of time.

$$u(t) = KP \cdot \{e(t) + (1/TI) \cdot \int e(\tau) d\tau + TD \cdot de(t)/dt\} \quad (4)$$

Therein, "e(t)" indicates a deviation in time "t", "$\int e(\tau) d\tau$" indicates the integral component of the deviation "e" and "de(t)/dt" indicates the derivative component of the deviation e(t) in the time "t".

An amount of operation u(t) thus obtained is transmitted through the line 81 to the power source controller 65. The power source controller 65 supplies an amount of electric power v(t) through the line 82 to the heater 61 based on the amount of operation u(t), and the heater 61 supplies an amount of heat corresponding thereto to the heating plate 60 based on the amount of electric power v(t).

In this manner, amounts of operation $u(t_0)$, $u(t_1)$, $u(t_2)$, $u(t_3)$ (to be continued) are transmitted to the power source controller 65 in accordance with the lapse of time such as $t_0$, $t_1$, $t_2$, $t_3$, (to be continued) and the power source controller 65 makes the heater 61 generate heat based on the amounts of operation to heat the heating plate 60. The temperature is detected by the temperature sensor 64 and feedback control is continuously performed based on the deviation "e" which is the difference between the target temperature "r", so that the temperature of the heating plate 60 becomes the target temperature "r".

Figure 8:
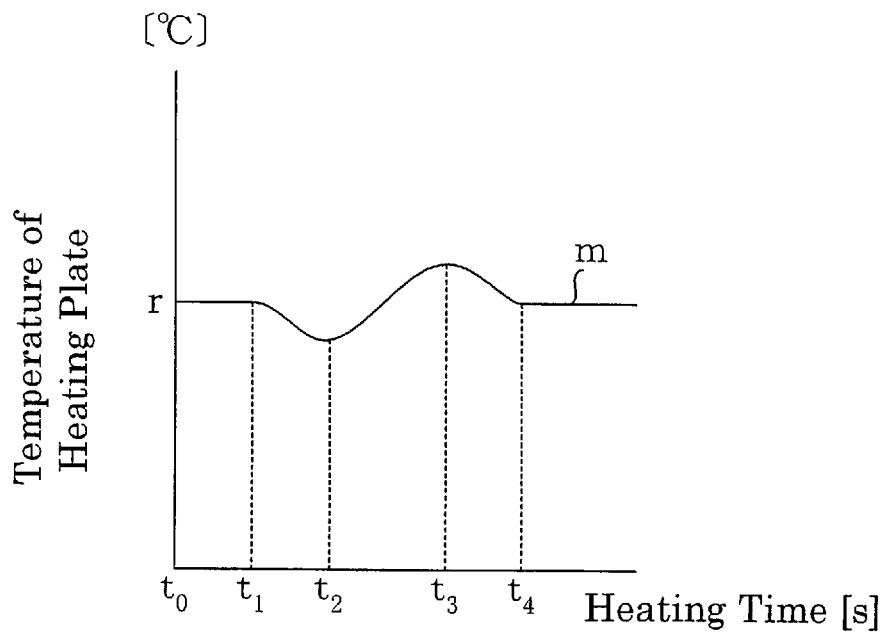
FIG. 8 is a graph showing temperature characteristics of a heating plate.

Next, the heat treatment by the heating plate 60 is explained based on FIG. 8. In FIG. 8, a horizontal axis indicates heating time [s, (second)] and a vertical axis indicates the temperature of the heating plate 60 [°]. First, the target temperature "r" is inputted to the temperature controller 62 and heating by the heater 61 is performed before the wafer W is placed so that the heating plate 60 is maintained at the target temperature as shown by Graph Line "m" in FIG. 8 (time $t_0$ to $t_1$).

Subsequently, the wafer W having a temperature of 23° C. (a room temperature) is placed on the heating plate 60. Although the heating plate 60 loses an amount of heat to the wafer w and its temperature is lowered (time $t_1$ to $t_2$), the temperature of the heater 61 can be properly controlled in the temperature controller 62 in which the respective optimum parameters are set, thereby keeping a drop in temperature of the heating plate 60 to a minimum. Thereafter, the temperature control of the heater 61 is performed as well, and the temperature of the heating plate 60 is raised in such a manner that substantial overheating does not occur (time $t_2$ to $t_3$). After that, when the temperature of the heating plate 60 is slightly over the target temperature "r", it is made reach the target temperature "r" or thereabout by weakening heating operation of the heater 61 (time $t_3$ to $t_4$). In this manner, the temperature of the heating plate 60 is stabilized at the target temperature "r".

Then, the wafer W, which is in a state of a high temperature by the heat treatment, is transferred to the cooling unit 30 and cooled to 23° C. Now cooling treatment of the wafer W is described. First, the temperature control of the cooling plate 100 by the temperature controller 103 is performed following almost the same procedure used by the temperature controller 62, and an amount of operation "u'", which is represented by a formula (5) described below, is calculated.

$$u'=KP'\{e'+(1/TI')\cdot \int e'd\tau+TD'\cdot de'/dt\} \quad (5)$$

Therein, "$\int e'd\tau$" indicates an integral component of a deviation "e" and "de/dt" indicates a derivative component of the deviation "e'" in time "t".

The following is a formula (6) when the amount of operation "u'" is considered as a function of time and represented as a function u'(t) of time.

$$u'(t)=KP'\{e'(t)+(1/TI')\cdot \int e(\tau)d\tau+TD'\cdot de(t)/dt\} \quad (6)$$

Therein, "e'(t)" indicates a deviation in the time "t", "$\int e'(\tau)d\tau$" indicates an integral component of the deviation "e'", and "de'(t)/dt" indicates a derivative component of the deviation e'(t) in the time "t".

The amount of operation u'(t) thus obtained is transmitted through the line 81 to the power source controller 102 and the power source controller 102 supplies an amount of electric power v'(t) through the line 82 to the Peltier element 101 based on the amount of operation u'(t). Then the Peltier element 101 cools the cooling plate 100.

A detected signal from the temperature sensor 104 (an observed temperature "y'") is inputted to the PID control parameter changing section 105, and the PID control parameter changing section 105 sets the respective control parameters of the respective operators 106 to 109 based on the detected signal (the observed temperature "y'").

Figure 9:
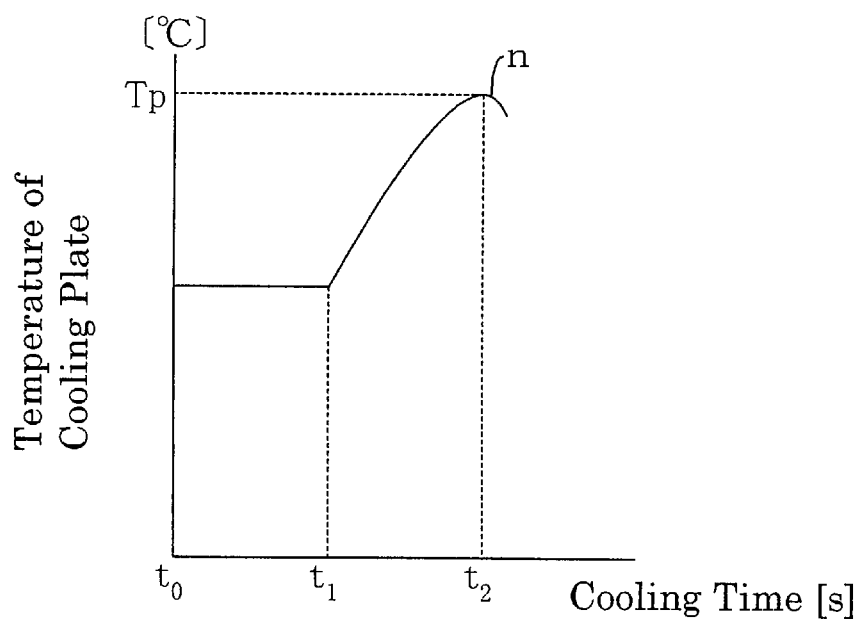
FIG. 9 is a graph showing an enlarged fragment of graph line indicating temperature characteristics of a cooling plate.

The settings are changed by the PID control parameter changing section 105 in the following. For example, the cooling plate is initially maintained at 23° C. (the room temperature) as shown by Graph "n" in FIG. 9 (time to to $t_1$). When the wafer W subjected to heat treatment is subsequently placed on the cooling plate 100, the cooling plate 100 receives an amount of heat from the wafer W and its temperature is raised to reach a peak temperature $T_P$ (time $t_1$ to $t_2$). Incidentally, the relation of an initial temperature of the wafer before the cooling treatment to the peak temperature $T_P$ is inspected in advance by experiments or the like, and the relation is tabulated and stored in a memory (not shown) of the PID control parameter changing section 105 beforehand. Consequently, the initial temperature of the wafer can be estimated by detecting the peak temperature $T_P$ after the wafer W is placed. Further, the PID control parameter changing section 105 sets the respective optimum control parameters, which are inspected in advance by experiments or the like as well, in the respective operators 106 to 109 based on the estimated temperature of the wafer.

Figures 10, 11:
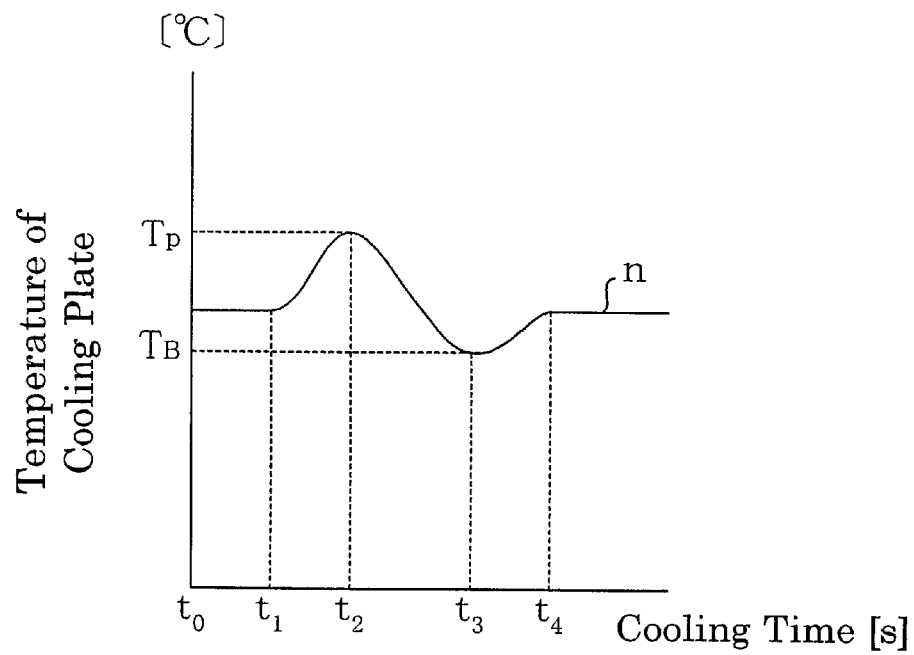
FIG. 10 is a graph showing the temperature characteristics of the cooling plate.
FIG. 11 is a table showing recovery time characteristics in an embodiment of heat treatment of the present invention.

Next, the cooling treatment by the cooling plate 100 is explained based on FIG. 10. In FIG. 10, a horizontal axis indicates cooling time [sec.] and a vertical axis indicates the temperature of the cooling plate 100 [° C.]. The wafer W is placed on the cooling plate 100 as shown by Graph Line "n" in FIG. 10. The settings of the PID control parameters are changed based on the peak temperature $T_P$ when the temperature of the cooling plate 100 is raised by the wafer W to reach the peak temperature $T_P$ on the occasion of placing the wafer W on the cooling plate 100. In the temperature controller 103 in which the respective optimum control parameters are set, the temperature of the Peltier element 101 can be properly controlled, whereby the temperature of the cooling plate 100 can be lowered in such a way that substantial overcooling does not occur (time $t_2$ to $t_3$). Then, when reaching a bottom temperature $T_B$, the temperature of the cooling plate 100 is raised by weakening cooling operation by the Peltier element 101 (time $t_3$ to $t_4$). Thus, the temperature of the cooling plate 100 is stabilized at 23° C.

Subsequently, the wafer W in a state of the room temperature by the cooling treatment is sequentially transferred to the extension unit 33, the peripheral aligner 51, the aligner (not shown), the baking unit 34, the cooling unit 30, the developing unit 16 or 18, the baking unit 34, and the cooling unit 30 to undergo predetermined processings.

In the baking unit 34, each individual target temperature "r" is inputted to the temperature controller 62 during heat treatment after either the exposing processing or the developing treatment, so that the temperature of the heating plate 60 is stabilized at the target temperature "r" in short recovery time in the same manner as that during the heat treatment after the resist coating. Additionally, in the cooling unit 30, each peak temperature $T_P$ is read during cooling treatment after either the post-exposure baking or the postbaking, so that the temperature of the cooling plate 100 is stabilized at 23° C. in short recovery time in the same manner as that during the cooling treatment after the prebaking.

According to such baking unit 34, the settings of the respective PID control parameters are changed by the PID control parameter changing section 63 at every different temperature, thereby enabling the temperature controller 62 to properly perform the temperature control corresponding to the various heating temperatures. Accordingly, it is possible to improve excess properties and shorten the recovery time regardless of the temperature when the heat treatment is performed on the wafer W. Therefore, a throughput is increased. Moreover, the stability of the temperature control is increased, whereby the wafer w can be uniformly heated, resulting in the improvement of the uniformity of the surface portion thereof.

On the other hand, according to the cooling unit 30, the settings of the respective PID control parameters can be changed based on the peak temperature $T_P$ after the wafer w that is the object to be cooled is placed on the cooling plate 100, whereby the temperature controller 103 can optimally control not only the temperature of the Peltier element 101 but also the temperature of the cooling plate 100 regardless of the temperature of the wafer when it is placed on the cooling plate 100. Additionally, even if the temperature of the wafer W that is the object to be cooled is anything other than an assumed temperature, the wafer W can be efficiently cooled under the always appropriate control parameters. Therefore, it is possible to improve the excess properties and shorten the recovery time regardless of the initial temperature of the wafer. As a result, the throughput is increased.

Further, the PID control, in which even the integral element and the derivative element are added, is adopted for the temperature controller 62 and 103, whereby a steady-state deviation (an offset) or thermal vibration is reduced and the temperature control with higher precision can be performed.

Incidentally, a route of carrying the wafer W in the coating and developing system 1 can be freely set so that the various heat treatments can be performed in the baking units 35 to 37 and 44 to 47, and the various cooling treatments can be performed in the cooling units 40 and 43. Moreover, a substrate may be the rectangular substrate such as an LCD substrate as well as the disk-shaped substrate such as the above-described wafer W.

Next, results, which are obtained by inspecting the respective control parameters and the characteristics such as the recovery time and the uniformity of the surface portion when the heat treatment is performed on the wafer W using the baking unit 34 according to the embodiment of the present invention, will be described.

In the baking unit 34, the heat treatment is performed by setting the respective control parameters in such a manner that $K_P=2.8$, $T_I=80$, $T_D=15$ in a pattern 1, by setting the respective control parameters in such a manner that $K_P=2.8$, $T_I=80$, $T_D=7$ in a pattern 2, and by setting the respective control parameters in such a manner that $K_P=4.0$, $T_I=49$, $T_D=12$ in a pattern 3. In these patterns 1 to 3, it is determined how the characteristics of the recovery time, an overshoot, the uniformity of the surface portion of the heating plate 60, and the uniformity of the surface portion of the wafer w are changed respectively when the temperature of the heating plate 60 is sequentially changed to such as 90° C., 120° C., 150° C., and 180° C. The results are shown in FIGS. 11 to 18.

Figures 12, 13:
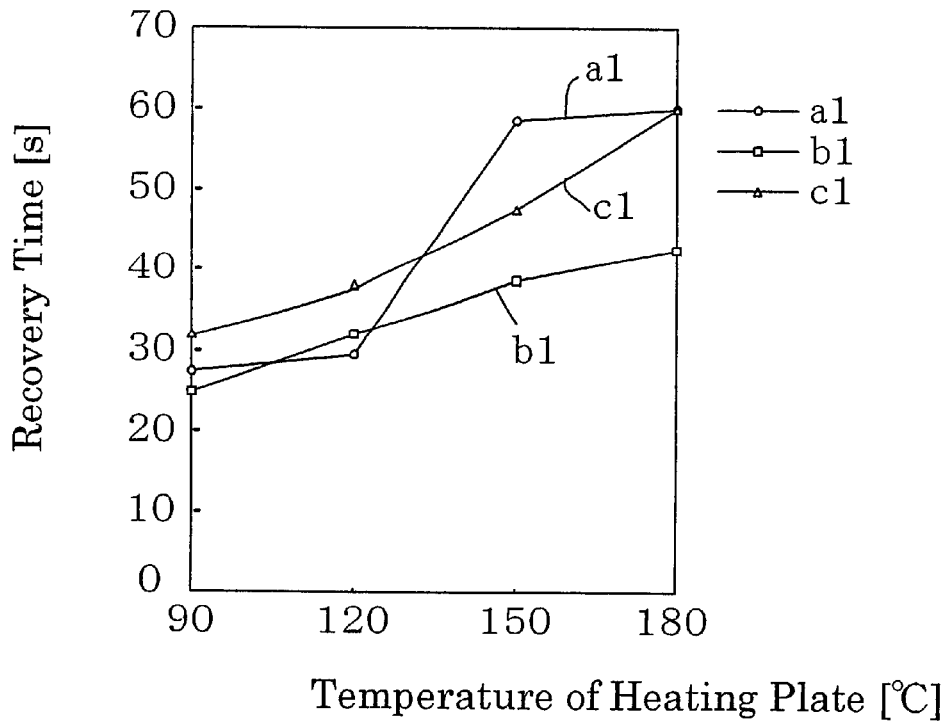
FIG. 12 is a graph showing the recovery time characteristics, which is made up based on the table in FIG. 11.
FIG. 13 is a table showing overshoot characteristics in the embodiment of the heat treatment of the present invention.
Figures 14, 15:
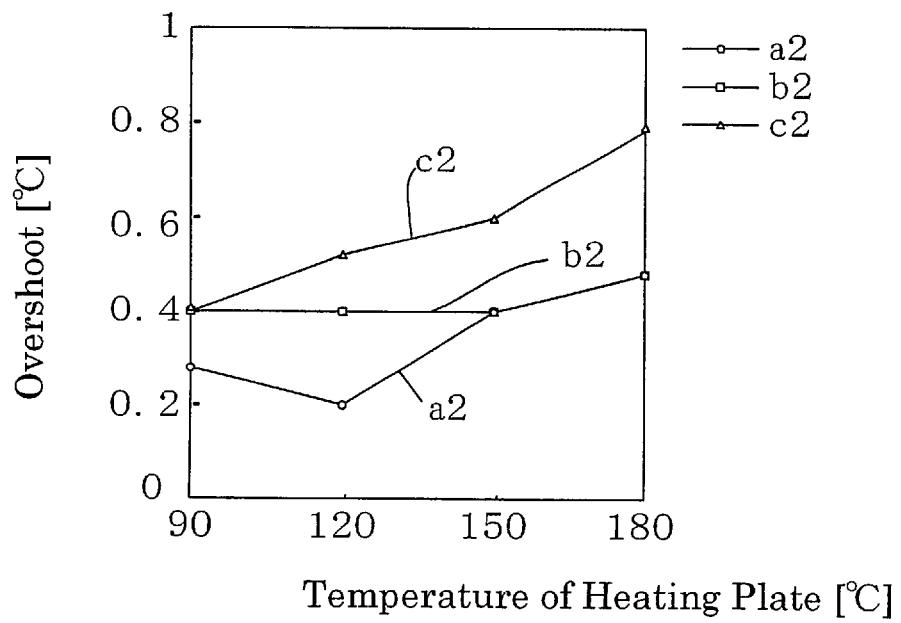
FIG. 14 is a graph showing the overshoot characteristics, which is made up based on the table in FIG. 13.
FIG. 15 is a table showing characteristics of dispersion 3σ of a wafer in the embodiment of the heat treatment of the present invention.
Figures 16, 17:
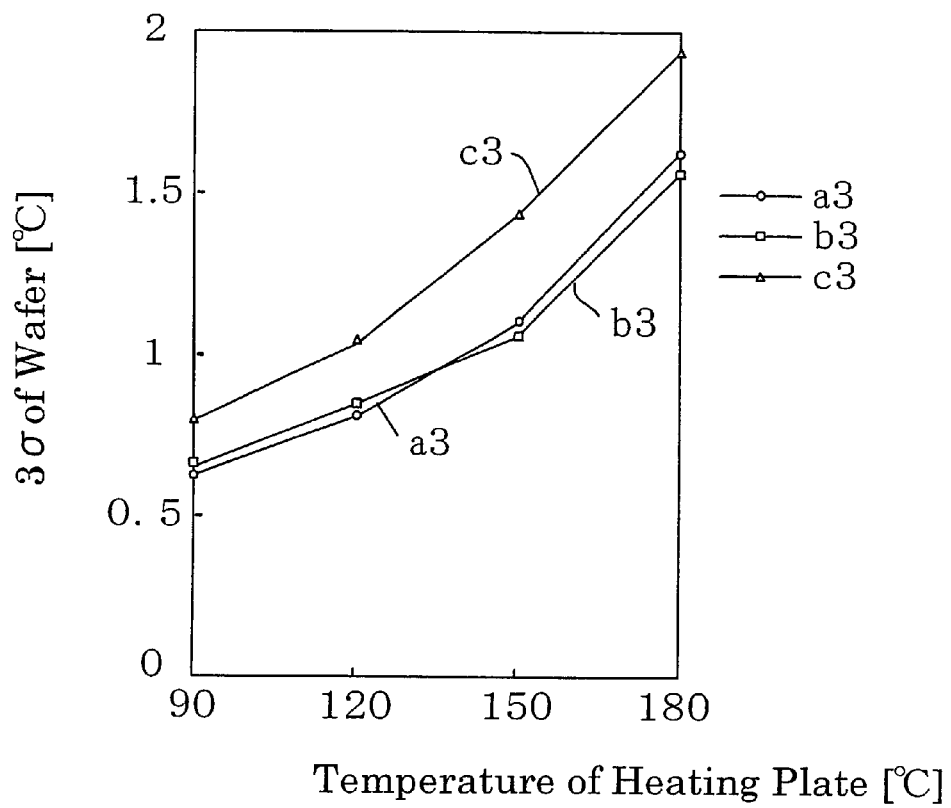
FIG. 16 is a graph showing the characteristics of the dispersion 3σ of the wafer, which is made up based on the table in FIG. 15.
FIG. 17 is a table showing characteristics of dispersion 3σ of the heating plate in the embodiment of the heat treatment of the present invention.
Figures 18, 19:
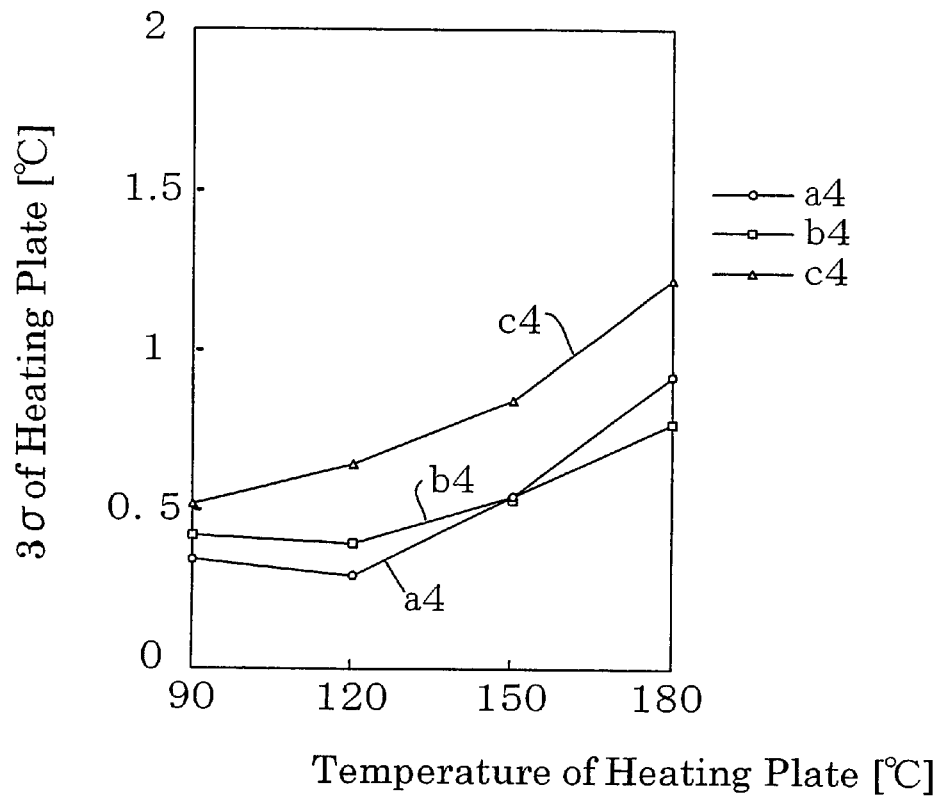
FIG. 18 is a graph showing the characteristics of the dispersion 3σ of the heating plate, which is made up based on the table in FIG. 17.
FIG. 19 is a table showing recovery time characteristics in a first embodiment of cooling treatment in the present invention.
Figure 22:
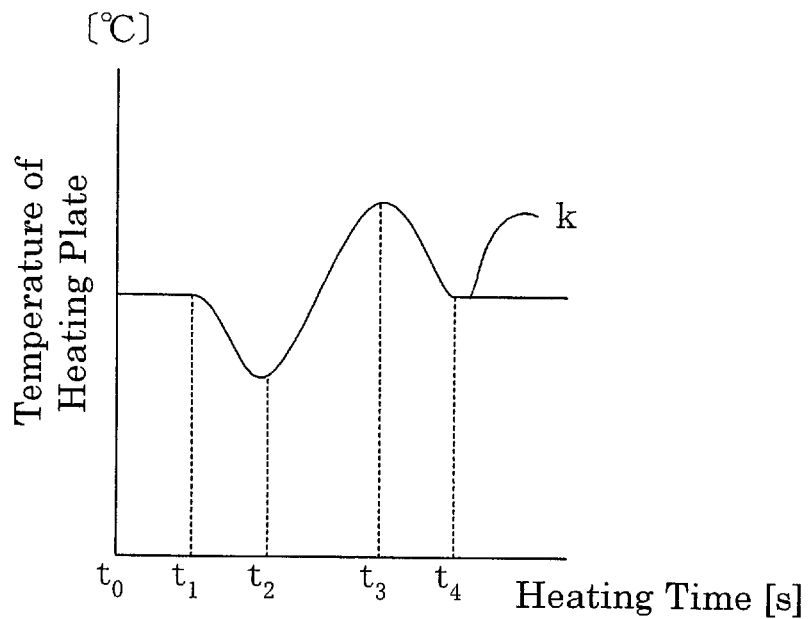
FIG. 22 is a graph showing temperature characteristics of a conventional heating plate.
Figure 23:
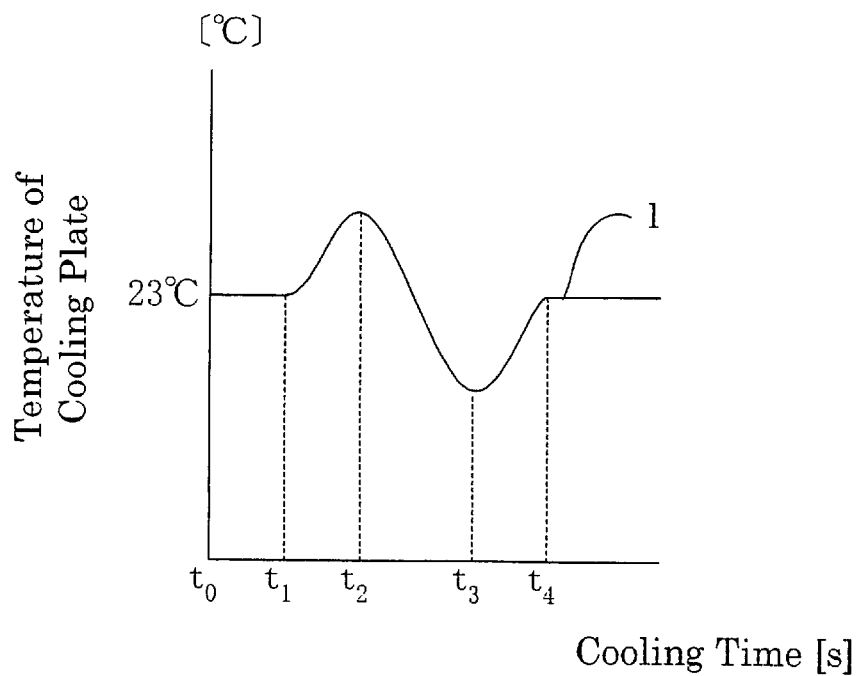
FIG. 23 is a graph showing temperature characteristics of a conventional cooling plate.

FIG. 11 is a table and FIG. 12 is a graph respectively showing the recovery time characteristics, FIG. 13 is a table and FIG. 14 is a graph respectively showing the overshoot characteristics, FIG. 15 is a table and FIG. 16 is a graph respectively showing the characteristics of the uniformity of the surface portion of the wafer W, FIG. 17 is a table and FIG. 18 is a graph respectively showing the characteristics of the uniformity of the surface portion of the heating plate 60. Graph Line a1 in FIG. 12, Graph Line a2 in FIG. 14, Graph Line a3 in FIG. 16, Graph Line a4 in FIG. 18 shows the respective characteristics in the pattern 1. Graph Line b1 in FIG. 12, Graph Line b2 in FIG. 14, Graph Line b3 in FIG. 16, Graph Line b4 in FIG. 18 shows the respective characteristics in the pattern 2. Graph Line c1 in FIG. 12, Graph Line c2 in FIG. 14, Graph Line c3 in FIG. 16, Graph Line c4 in FIG. 18 shows the respective characteristics in the pattern 3.

In such baking unit 34, the patterns 1 to 3 are stored in the PID control parameter changing section 63 beforehand. In addition, the PID control parameter changing section 63 sets the respective control parameters of the temperature controller 62 according to, for example, the pattern 1 when the target temperature "r" is 120° C. and according to the pattern 2 when the target temperature "r" is 180° C. As a result, when the target temperature "r" is 120° C., it is possible to reduce the recovery time to 30 seconds, the overshoot to 0.2° C., dispersion $3\sigma$ in the temperatures of the wafer surface portion (three times a standard deviation ) to 0.85° C., and dispersion $3\sigma$ in the temperatures of the heating plate 60 (three times a standard deviation $\sigma$) to 0.26° C., respectively, and when the target temperature "r" is 180° C., it is possible to reduce the recovery time to 44 seconds, the overshoot to 0.5° C., dispersion $3\sigma$ in the temperatures of the wafer surface portion (three times a standard deviation $\sigma$) to 1.63° C., and dispersion $3\sigma$ in the temperatures of the heating plate 60 (three times a standard deviation ($\sigma$) to 0.77° C., respectively. If the respective control parameters of the temperature controller 62 are fixed to those in the pattern 1, the recovery time becomes 61 seconds when the target temperature "r" is 180° C. Thus, it is possible to recognize that the recovery time and the characteristics such as the uniformity of the surface portion of the wafer W are made preferable by changing the respective control parameters depending on the target temperature "r".

Next, the recovery time characteristics are inspected by performing the cooling treatment on the wafer W using the cooling unit 30 according to the embodiments of the present invention.

As a first embodiment of the cooling treatment, the recovery time is measured when the initial temperature of the wafer is in a low temperature range (90° C., 120° C.). Incidentally, conditions are set as follows. An ambient temperature is set at 23° C., an amount of cooling water is set at 3 liters per minute, a proximity gap is set at 0.10 mm, carrying time required to carry the wafer from the baking unit 34 to the cooling unit 30 is set at 6 seconds, and the respective control parameters are set in such a manner that $K_P=2$, $A=0.8$, $T_I=5$, $T_D=1$, and then two cases where a temperature of the cooling water is 90° C. and 120° C. are inspected. The results are shown in FIG. 19. Incidentally, "A" is a constant for preventing an overshoot in advance by limiting a range in which integral operation is made effective, and its unit is [° C.].

As shown in FIG. 19, the recovery time can be shortened to 30 seconds or less when the initial temperature of the wafer is in the low temperature range (90° C., 120° C.) by selecting the respective control parameters described above.

Further, as a second embodiment of the cooling treatment, the settings of the respective control parameters are changed to $K_P=2$, $A=1$, $T_I=5$, $T_D=2$, and the recovery time when the initial temperature of the wafer is 90° C., 120° C., 150° C., and 200° C. is measured. The results are shown in FIG. 20.

The recovery time can be shortened by selecting the respective control parameters as shown in FIG. 20. For example, it is preferable that the temperature control is performed according to the settings of the respective control parameters in the first embodiment when the initial temperature of the wafer is 90° C. or 120° C., and the temperature control is performed according to the settings of the respective control parameters in the second embodiment when the initial temperature of the wafer is 150° C. or 200° C. Consequently, the recovery time can be shortened depending on the initial temperature of the wafer.

Furthermore, the peak temperature $T_P$ and reaching time required to reach the peak temperature $T_P$ (corresponding to time $t_1$ to $t_2$ in above FIG. 10) when the initial temperature of the wafer is 200° C. or 250° C. are measured. The results are shown in FIG. 21.

The relation between the peak temperature $T_p$ and the initial temperature of the wafer is tabulated and stored in the PID control parameter changing section 105 beforehand as shown in FIG. 21. The respective optimum control parameters can be selected according to the initial temperature of the wafer estimated from the peak temperature $T_P$, when the cooling treatment is performed. The relation between the initial temperature of the wafer and the reaching time may naturally be stored.

According to the present invention, it is possible to improve the excess properties and shorten the recovery time regardless of the temperature when the heat treatment is performed on the substrate. As a result, the throughput can be increased. Moreover, the stability of the temperature control is increased, whereby it is possible to heat the substrate uniformly to improve the uniformity of the surface portion thereof. The steady-state deviation (the offset) or thermal vibration is reduced, whereby the temperature control with higher precision can be performed.

According to the present invention, it is possible to improve the excess properties and shorten the recovery time required for cooling to the predetermined temperature regardless of the temperature of the substrate when it is placed on the cooling plate. Accordingly, the throughput can be increased. Additionally, the steady-state deviation (the offset) or the like is reduced, whereby the temperature control with higher precision can be performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat treatment unit for subjecting a substrate to heat treatment comprising:

a heating plate on which the substrate is placed;

a heating element which heats said heating plate at different temperatures;

a temperature controller which controls a temperature of said heating element according to a transfer function; and a control parameter changing section which changes a setting of a control parameter in the transfer function at each of the different temperatures.

2. The heat treatment unit according to claim 1, wherein said temperature controller controls the temperature of said heating element according to PID control.

3. The heat treatment unit according to claim 1, wherein said control parameter changing section includes a PID control parameter changing section which changes settings of PID control parameters at every different temperature.

4. The heat treatment unit according to claim 1, wherein said heating plate includes a temperature sensor attached thereto, and said temperature controller calculates an amount of operation based on a detected signal from said temperature sensor and the parameters of said control parameter changing section, and controls said heating element in accordance with the amount of operation so that said heating plate generates heat within a given range.

5. The heat treatment unit according to claim 4, wherein said control parameter changing section stores data on a plurality of control parameters optimum for a target temperature in each of various heat treatments which are inspected in advance, and selects the optimum parameters from the stored data based on the target temperature to change the control parameters.

6. The heat treatment unit according to claim 4, wherein said heating element is embedded in said heating plate.

7. A heat treatment unit for subjecting a substrate to heat treatment comprising:

a heating plate on which the substrate is placed;

a heating element which heats said heating plate at different temperatures;

a temperature controller which controls a temperature of said heating element according to a transfer function represented by the following relational expression; and a control parameter changing section which changes at least any one setting of a proportional operation coefficient, integral time or derivative time among control parameters in the transfer function at each of the different temperatures, $$u=KP\{e+(1/TI)\cdot\int edt+TD\cdot de/dt\}$$

where "u" expresses an amount of operation, "e" expresses a deviation, $K_P$ expresses the proportional operation coefficient (a proportional gain), $T_I$ expresses the integral time and $T_D$ expresses the derivative time, respectively.

* * * * *